(12) United States Patent
Shoji et al.

(10) Patent No.: US 9,788,467 B2
(45) Date of Patent: Oct. 10, 2017

(54) SHIELD CASE

(71) Applicant: FUJITSU LIMITED, Kawasaki-shi, Kanagawa (JP)

(72) Inventors: Hiromu Shoji, Kawasaki (JP); Atsushi Kaneko, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/220,362

(22) Filed: Jul. 26, 2016

(65) Prior Publication Data
US 2017/0034961 A1 Feb. 2, 2017

(30) Foreign Application Priority Data

Jul. 27, 2015 (JP) ................. 2015-148010

(51) Int. Cl.
*H05K 9/00* (2006.01)
(52) U.S. Cl.
CPC ......... *H05K 9/0024* (2013.01); *H05K 9/0016* (2013.01); *H05K 9/0028* (2013.01)

(58) Field of Classification Search
CPC ... H05K 9/0016; H05K 9/0024; H05K 9/0028
See application file for complete search history.

(56) References Cited

U.S. PATENT DOCUMENTS

| | | | | |
|---|---|---|---|---|
| 5,991,165 | A | * | 11/1999 | Jones, Jr. ............ H05K 9/0022 206/719 |
| 6,150,606 | A | * | 11/2000 | Matsumoto .......... H05K 9/0037 174/351 |
| 2006/0134982 | A1 | * | 6/2006 | Zarganis ............ H01R 23/6873 439/607.01 |

FOREIGN PATENT DOCUMENTS

| | | |
|---|---|---|
| JP | 2003-101280 | 4/2003 |
| JP | 2014-75682 | 4/2014 |

* cited by examiner

*Primary Examiner* — Hung V Ngo
(74) *Attorney, Agent, or Firm* — Fujitsu Patent Center

(57) ABSTRACT

A shield case that shields an electronic component, the shield case including: a shield frame configured to be fastened to a board so as to surround the electronic component mounted over a mount face of the board, and a spring, attached to the shield frame, including a flat face configure to closely adheres to the mount face by being pressed when the shield frame unit is fastened.

7 Claims, 11 Drawing Sheets

SHIELD CASE

CROSS-REFERENCE TO RELATED APPLICATION

This application is based upon and claims the benefit of priority of the prior Japanese Patent Application No. 2015-148010, filed on Jul. 27, 2015, the entire contents of which are incorporated herein by reference.

FIELD

The embodiments discussed herein are related to a shield case.

BACKGROUND

In an electronic apparatus, a board on which electronic components are mounted is arranged inside a casing. Some electronic components are provided with a shield case that covers the mounted part of the board as a protection, for example, against interference from electromagnetic waves caused by other electronic components. Further, such a shield case may be utilized, for example, so as to block diffusion of electromagnetic waves caused by the covered electronic components into the surroundings.

A known method of manufacturing a shield case uses a sheet metal or die casting for example. A sheet metal shield case manufactured using a sheet metal is typically mounted on a board by surface-mount technology (SMT). In contrast, a die casting shield case manufactured by die casting is advantageous in terms of costs when the product quantity is large. In actuality, however, a die casting shield case is typically fixed to a board using fastening members, such as screws, the number of which is large so as to ensure the shield property, and is highly likely to be heavy.

Japanese Laid-open Patent Publication No. 2014-75682 and Japanese Laid-open Patent Publication No. 2003-101280 are examples of related art.

SUMMARY

According to an aspect of the invention, a shield case that shields an electronic component, the shield case includes a shield frame configured to be fastened to a board so as to surround the electronic component mounted over a mount face of the board, and a spring, attached to the shield frame, including a flat face configure to closely adheres to the mount face by being pressed when the shield frame unit is fastened.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A and 4B are diagrams for comparing the shield case according to the first embodiment with a shield case according to a comparison example, in which FIG. 4A illustrates the shield case according to the first embodiment and FIG. 4B illustrates the shield case according to the comparison example;

DESCRIPTION OF EMBODIMENTS

The present application has been made in view of the above-described circumstances and is aimed at providing techniques that may reduce the weight and the number of assembly man-hours while ensuring the shield property of electronic components mounted over a board, by decreasing the number of fastening members with which a shield case is fastened to the board.

Embodiments of the present application are described in detail below with reference to the drawings.

First Embodiment

Figure 1:
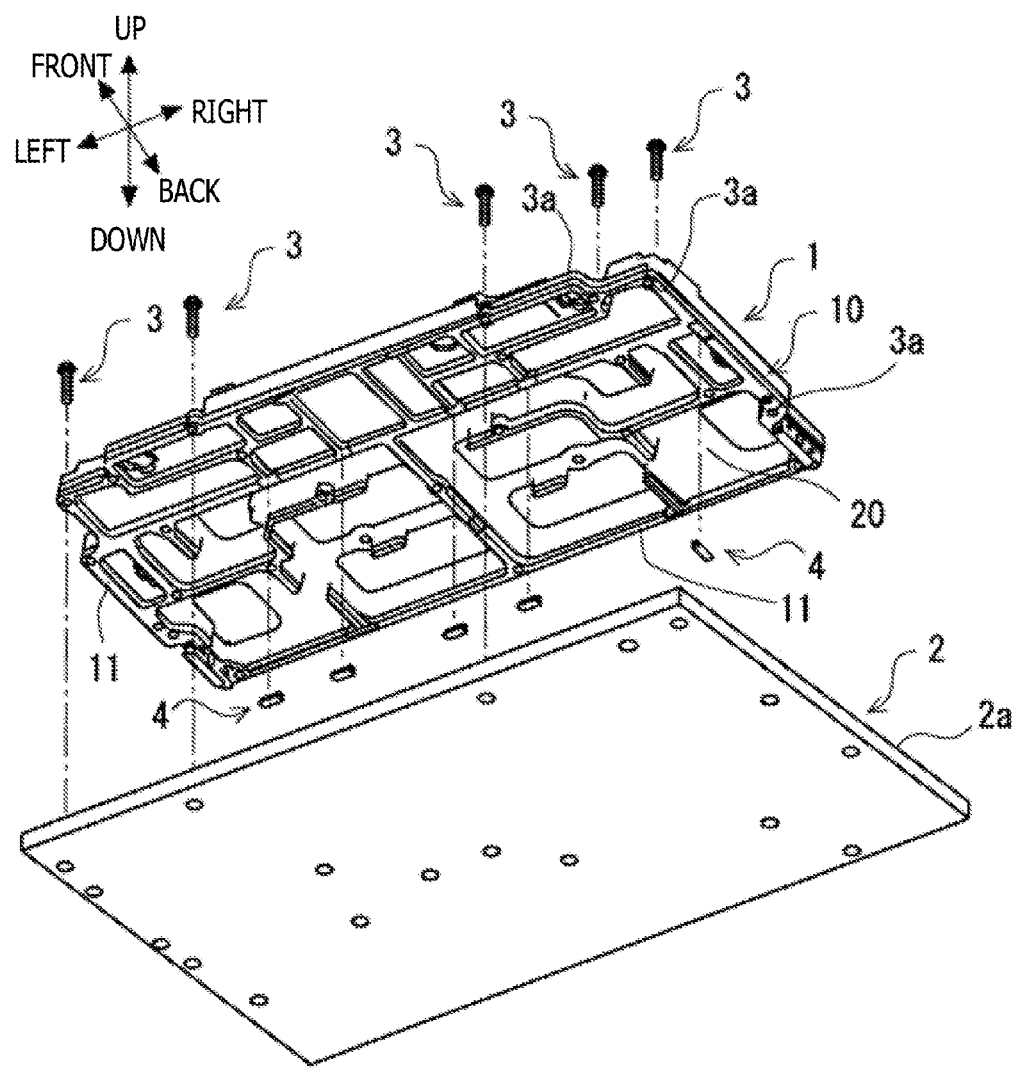
FIG. 1 is an exploded perspective view that illustrates a shield case according to a first embodiment and a board to which the shield case is fixed.

FIG. 1 is an exploded perspective view that illustrates a shield case 1 according to a first embodiment and a board 2 to which the shield case 1 is fixed.

The board 2 is a printed wiring board with a mount face 2a over which electronic components, not illustrated, are mounted. The shield case 1 according to the present embodiment is made by die casting for example. The shield case 1 includes a shield frame unit 10 and a shield upper lid unit 20, and shield spaces 30 (see FIG. 4A) that accommodate the electronic components are formed inside the shield frame unit 10 and the shield upper lid unit 20. Although in the shield case 1 illustrated in FIG. 1, the shield frame unit 10 is provided also in portions other than the outer edge portion of the shield case 1 and a plurality of shield spaces, that is, the shield spaces 30 are formed accordingly through the partitioning of the shield frame unit 10, the shield case 1 is not limited thereto.

The shield frame unit 10 of the shield case 1 is a wall member fixed to the board 2 in a state of closely contacting with (or closely adhering to) the board 2 so as to surround the electronic components mounted over the board 2, and is fixed to the board 2 using screws 3. Further, the shield frame unit 10 is provided so as to stand vertically from the mount face 2a of the board 2 in the state where the shield case 1 is fixed to the board 2, and includes a frame bottom face 11 that closely adheres to the mount face 2a and is flat. In contrast, the shield upper lid unit 20 of the shield case 1 is a lid member that covers upper portions of the electronic components mounted over the board 2 and is structured so as to be integral with the shield frame unit 10 for example.

The shield case 1 is a shield member for interrupting influence of disturbance caused by, for example, electronic waves or blocking diffusion of electromagnetic waves emitted from the electronic components mounted over the board 2. The board 2 is used as a component that constitutes a computer, such a mobile phone or a personal computer (PC). In FIG. 1, the illustration of part of the shield upper lid unit 20 is omitted. In the example illustrated in FIG. 1, one face of the board 2 is formed as the mount face 2a over which the electronic components are mounted. The mount face 2a may be formed on each of both faces of the board 2. For convenience of explanation on the present embodiment, hereinafter, in the shield case 1 fixed to the mount face 2a of the board 2, the side on which the shield upper lid unit 20 is provided is regarded as the "upside" and the side on which the frame bottom face 11 of the shield frame unit 10 is provided is regarded as the "downside".

Figure 2:
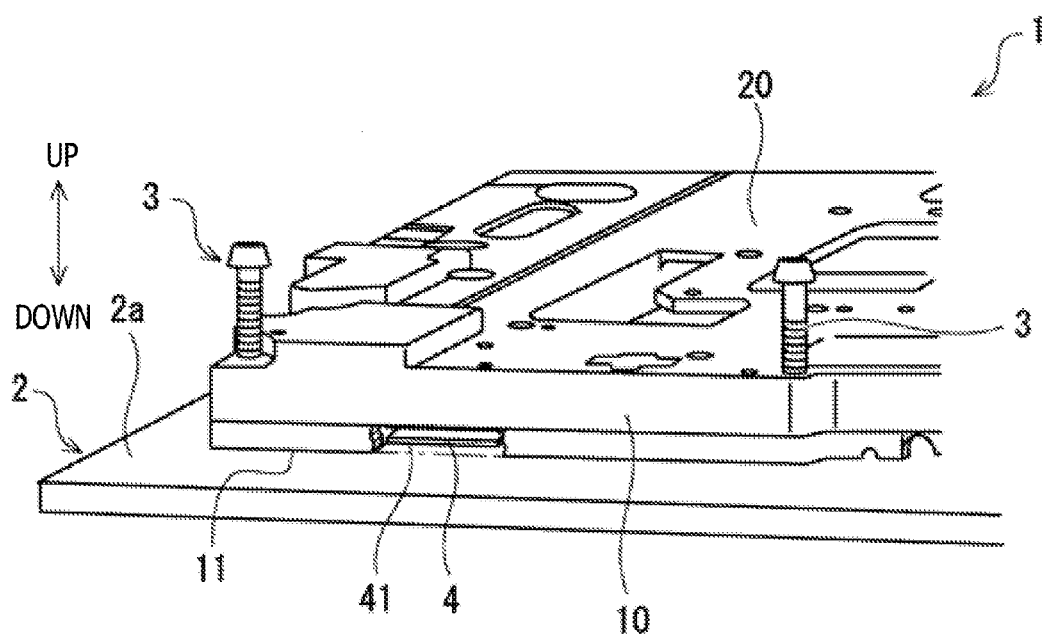
FIG. 2 is a diagram for describing a structure where the shield case is fixed to the board.

FIG. 2 is a diagram for describing a structure where the shield case 1 is fixed to the board 2. In the shield case 1, for example, the shield frame unit 10 is fastened to the board 2 using fastening members, such as the screws 3. When the shield frame unit 10 is fastened to the board 2 using the screws 3, the shield property may be ensured since the frame bottom face 11 that is formed as a lower end face of the shield frame unit 10 and is flat and closely adheres to the mount face 2a of the board 2. As for a typical shield case made by die casting, screws are desired for fastening for each one-fourth wavelength of electromagnetic waves emitted from electronic components so as to ensure the shield property. As a result, the number of screws for fixing the shield case to the board becomes large and issues may occur, such as increase in the weight of the shield case or increase in the number of assembly man-hours.

Thus, in the shield case 1 according to the present embodiment, spring members 4 with elasticity are embedded in the shield frame unit 10 as schematically illustrated in FIG. 2. In fixing the shield case 1 to the board 2 using the screws 3, each of contact faces 41 of the spring members 4, which is flat, is pushed against the mount face 2a of the board 2 and the spring member 4 is pressed, and accordingly, the spring member 4 closely adheres to the mount face 2a so that the shield property of the shield case 1 is ensured. In the present embodiment, portions that are typically fixed using screws are partially fixed by the spring members 4 instead. As a result, the total number of the screws 3 used to fix the shield case 1 to the board 2 may be decreased, compared to a typical shield case, and the weight and the number of assembly man-hours of the shield case 1 may be reduced.

Figure 3:
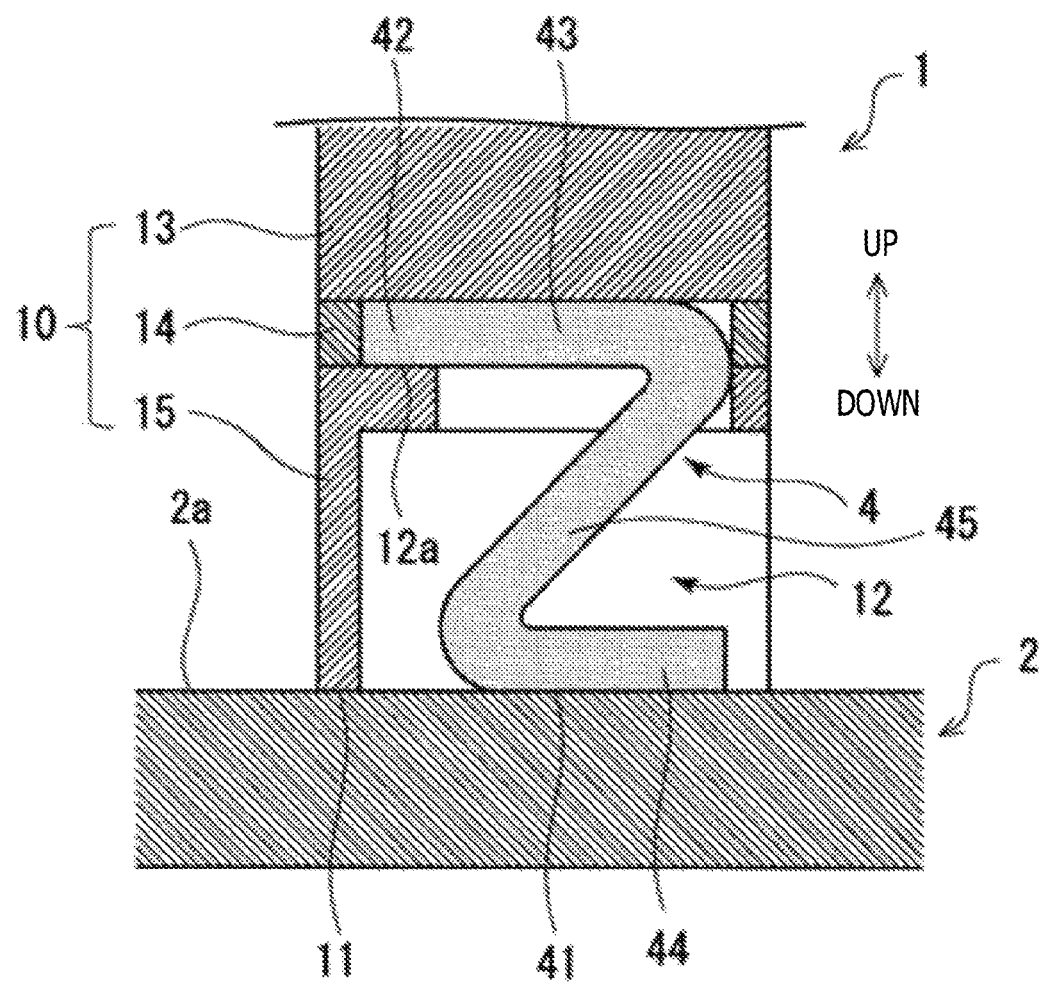
FIG. 3 is a cross-sectional view for describing a spring member in a state where the shield case is fastened to the board.

FIG. 3 is a cross-sectional view for describing the spring member 4 in the state where the shield case 1 is fastened to the board 2. The spring member 4 according to the first embodiment is arranged in a spring accommodating depression 12 formed in the shield frame unit 10. A fixing portion 12a for fixing the spring member 4 is provided in the spring accommodating depression 12. As illustrated in FIG. 3, the spring member 4 is a plate-like spring member with a Z-shaped cross section, and on one end side of the spring member 4, a fixed portion 42 that is fixed to the fixing portion 12a is provided. The spring member 4 extends in a direction orthogonal to the Z-shaped cross section and hereinafter, the extending direction is referred to as the longitudinal direction. The shape of the cross section of the spring member 4 is not limited to the Z shape and various shapes may be employed.

The spring member 4 includes a pair of parallel plate portions, which are a first horizontal plate portion 43 and a second horizontal plate portion 44, and includes an oblique plate portion 45, which is coupled to the first horizontal plate portion 43 and the second horizontal plate portion 44 so as to be oblique. In the cross section, the first horizontal plate portion 43 and the second horizontal plate portion 44 are each shaped like a rectangle, and the width of the first horizontal plate portion 43 is longer than the width of the second horizontal plate portion 44. Further, as illustrated in FIG. 3, the fixed portion 42 of the spring member 4 is provided in an end portion of the first horizontal plate portion 43. The contact face 41 is formed on the second horizontal plate portion 44.

In the spring member 4, the fixed portion 42 is fixed to the fixing portion 12a formed in the spring accommodating depression 12 so that the contact face 41 that is flat and used to be pushed against the mount face 2a of the board 2 in fastening the shield case 1 comes into a position in which the contact face 41 faces the outside of the spring accommodating depression 12. In the spring member 4 before the shield frame unit 10 is fastened to the board 2, part of the spring member 4 is exposed outside the spring accommodating depression 12 so that the contact face 41 projects farther than the frame bottom face 11 of the shield frame unit 10. In contrast, in fastening the shield case 1, the contact face 41 of the spring member 4, which projects from the frame bottom face 11 of the shield frame unit 10, is pushed against the mount face 2a of the board 2 and the spring member 4 is pressed, and accordingly, the contact face 41 comes into the state of being closely contacted with the mount face 2a as illustrated in FIG. 3.

Figure 4A:
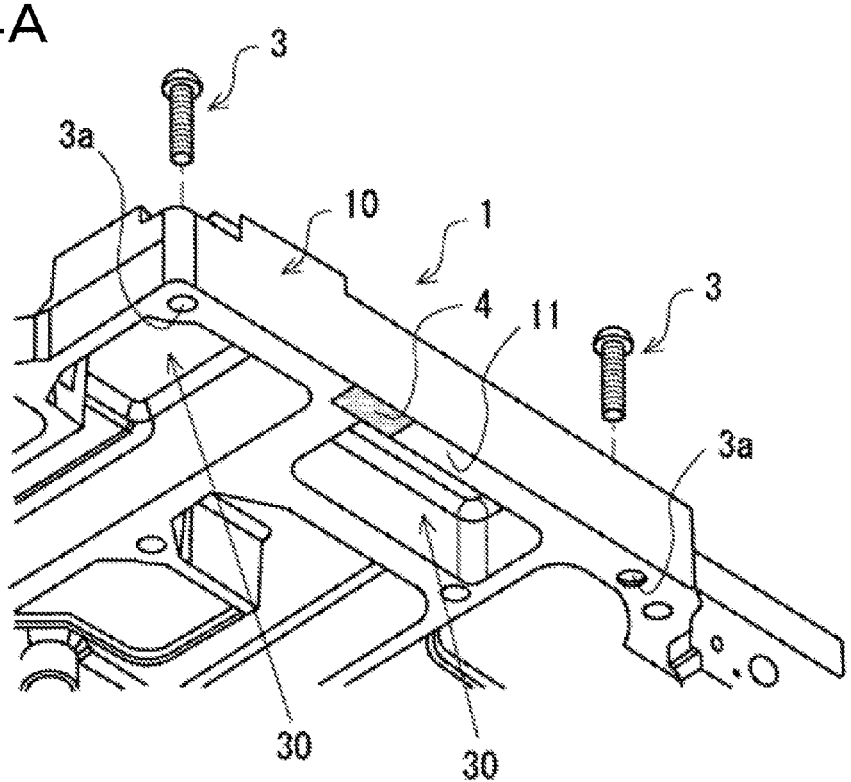
Figure 4B:
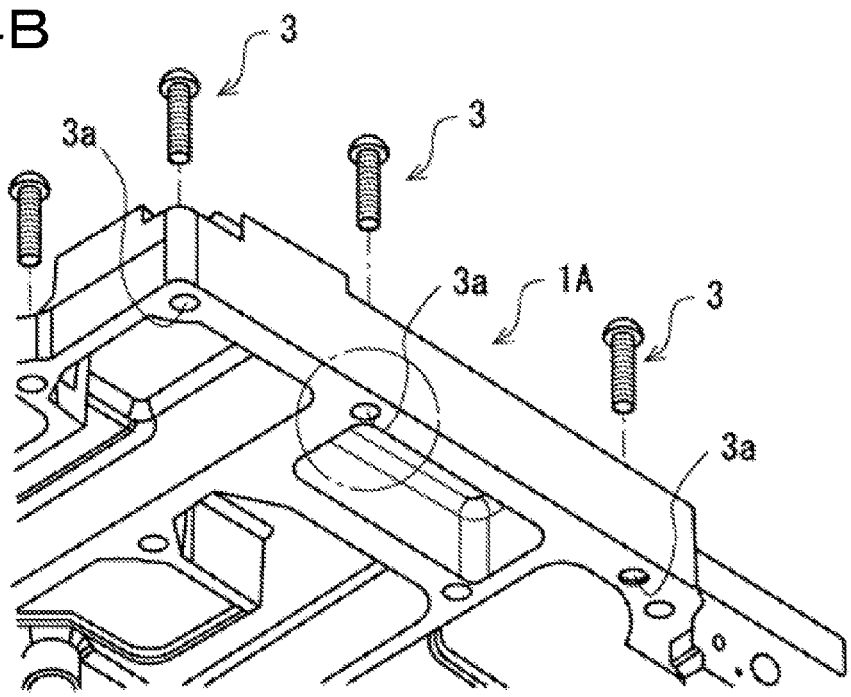

FIGS. 4A and 4B are diagrams for comparing the shield case 1 according to the first embodiment with a shield case 1A according to a comparison example. References 3a in FIGS. 4A and 4B indicate screw holes into which the screws 3 are inserted. FIG. 4A illustrates the shield case 1 according to the first embodiment and FIG. 4B illustrates the shield case 1A according to the comparison example.

As illustrated in FIG. 4A, in the shield case 1 according to the first embodiment, the spring member 4 is attached between the two screw holes 3a. The spring member 4 is pressed when the screws 3 are inserted into the screw holes 3a to perform the fastening to the board 2, and the contact face 41 closely adheres to the mount face 2a. Thus, the shield case 1 according to the first embodiment has a structure in which the screws 3 and the spring members 4 that replace the screws 3 cooperate to ensure the shield property. In contrast, the shield case 1A according to the comparison example does not include the spring members 4, and has a structure in which the shield property of the shield case 1A is ensured with the screws 3 only. Accordingly, the number of the screws 3 that are used becomes large and such a structure may easily cause increase in the weight of the shield case 1A or increase in the number of assembly man-hours. In the present embodiment, the screw 3 in the center of a portion where three of the screws 3 are arranged in succession in the shield case 1A according to the comparison example is replaced with the spring member 4.

Figure 5:
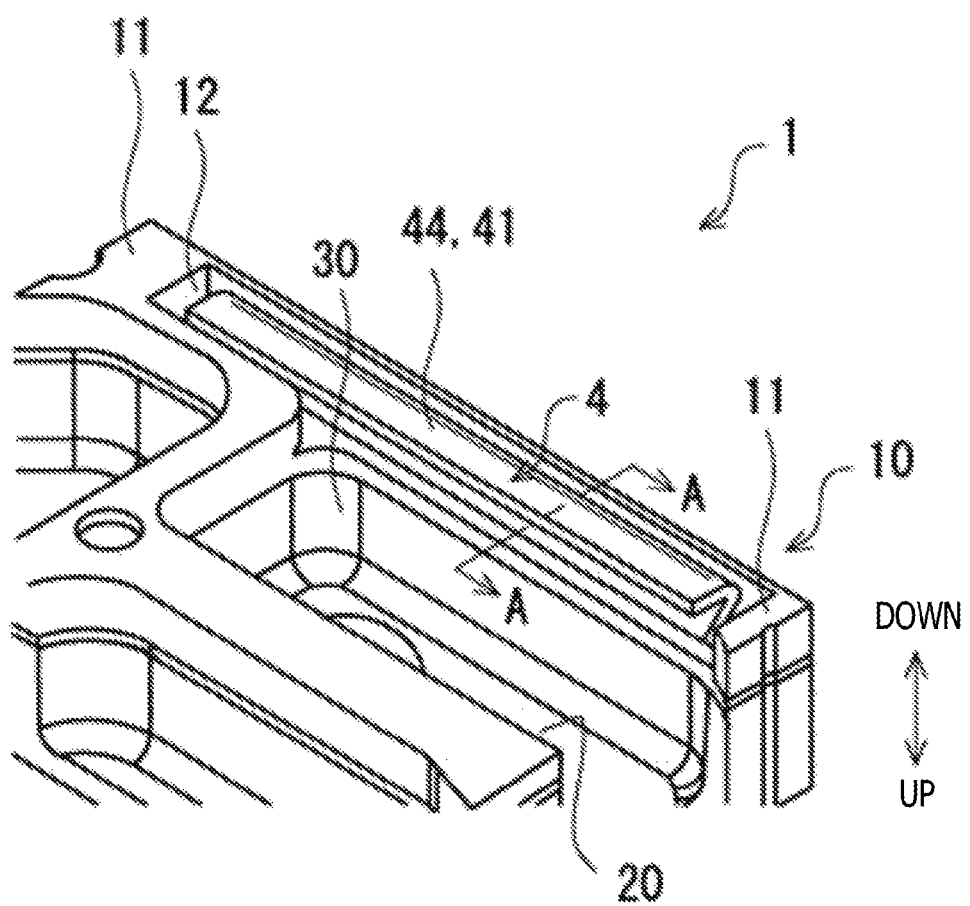
FIG. 5 is a diagram that illustrates an installation structure of the spring member in the shield case according to the first embodiment.
Figure 6:
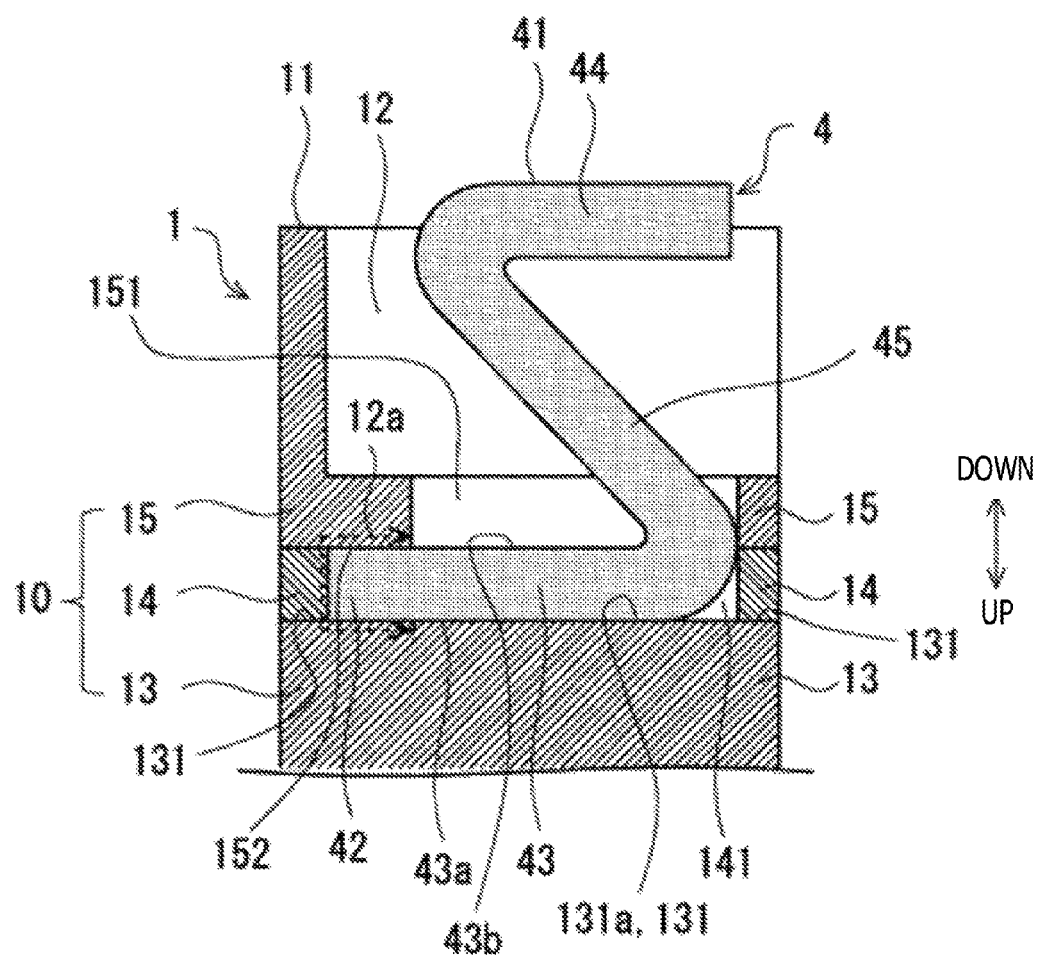
FIG. 6 is a cross-sectional view based on arrows A in FIG. 5.

Subsequently, an installation structure of the spring member 4 in the shield case 1 is described. FIG. 5 is a diagram that illustrates the installation structure of the spring member 4 in the shield case 1 according to the first embodiment. FIG. 6 is a cross-sectional view based on arrows A in FIG. 5.

While the shield case 1 including the shield frame unit 10 and the shield upper lid unit 20 is made by die casting, the spring member 4 is formed using phosphor bronze or beryllium copper for example, which is a metal different from the shield frame unit 10. As a technique of fixing the spring member 4 to the shield frame unit 10 in the shield case 1, the present embodiment employs a method in which the shield case 1 is caused to have a three-layer structure including the first layer 13, the second layer 14, and the third layer 15 and diffused junction is performed on these layers in the state where the spring member 4 is embedded. The diffused junction is a technique by which metallic materials to be joined are caused to closely adhere to one another and the metallic materials are joined to one another on an atom basis by utilizing the diffusion of atoms caused on each junction face among the metallic materials through pressurization and heating in an atmosphere of vacuum, inert gas, or the like.

Figure 7:
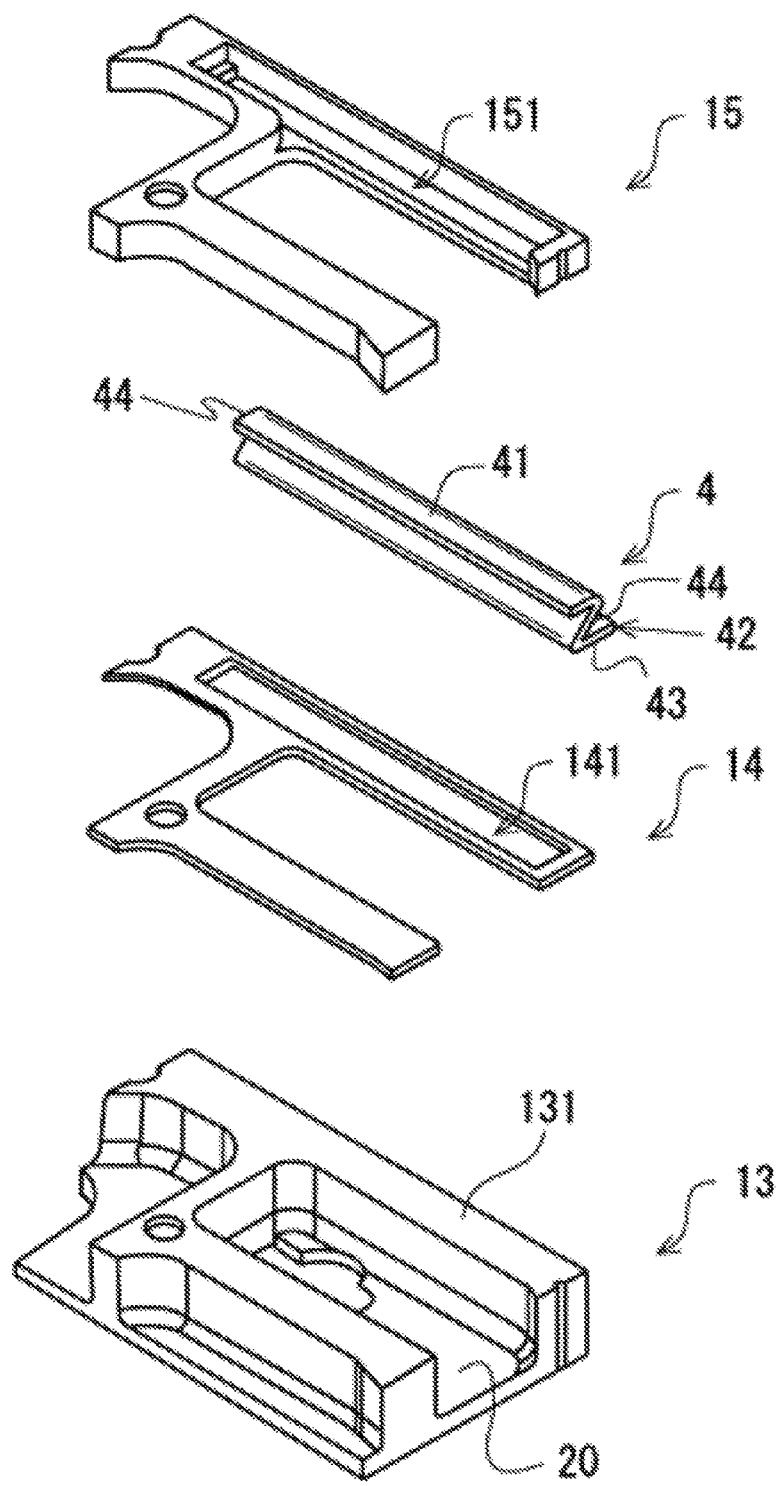
FIG. 7 is an exploded perspective view that illustrates part of the shield case according to the first embodiment, which is disassembled in a layer direction.

The shield case 1 includes the first layer 13, the second layer 14, and the third layer 15, which are stacked in the thickness direction and integrated by the diffused junction. FIG. 7 is an exploded perspective view that illustrates part of the shield case 1 according to the first embodiment, which is disassembled into the first layer 13, the second layer 14, and the third layer 15. The first layer 13 is a layer that forms the shield upper lid unit 20 of the shield case 1 and an upper side region of the shield frame unit 10. The third layer 15 is a layer that forms a lower end region of the shield frame unit 10. The second layer 14 is an intermediate layer positioned between the first layer 13 and the third layer 15. The first layer 13, the second layer 14, and the third layer 15 are stacked in this sequence and integrally joined by the diffused junction.

Figure 8A:
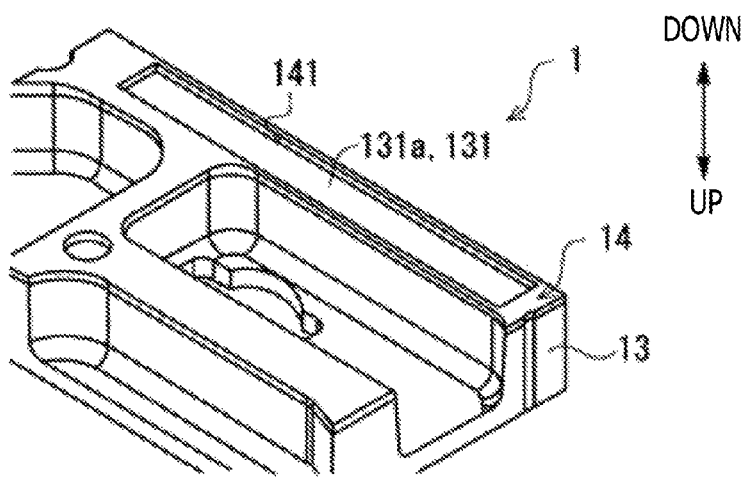
FIG. 8A is a first diagram that illustrates a process of embedding the spring member in a shield frame unit of the shield case according to the first embodiment.

As illustrated in FIG. 7, the first layer 13 includes a support face 131, which is flat and used in stacking the second layer 14. The second layer 14 is provided with an accommodating hole 141, which is a through hole shaped like a rectangle and passing through the second layer 14 in the thickness direction. When the spring member 4 is installed in the shield case 1, as illustrated in FIG. 8A, the second layer 14 is placed on the support face 131 of the first layer 13. The accommodating hole 141 in the second layer 14 has a shape and a size the same as those of the first horizontal plate portion 43 of the spring member 4.

Figure 8B:
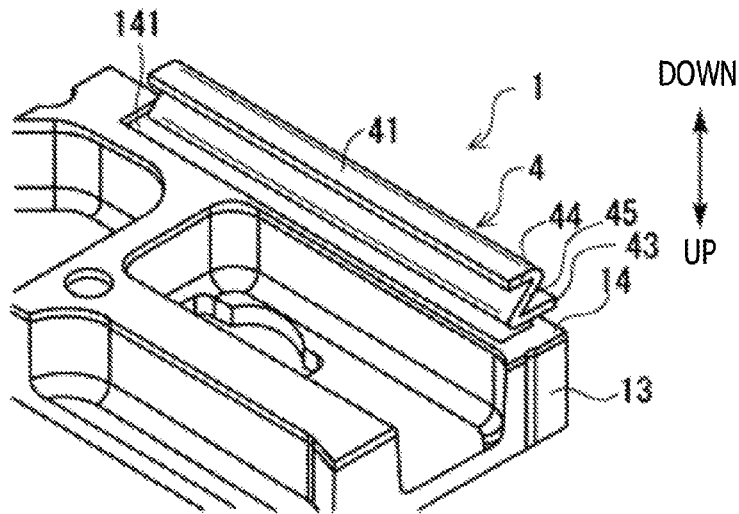
FIG. 8B is a second diagram that illustrates the process of embedding the spring member in the shield frame unit of the shield case according to the first embodiment.

In the present embodiment, for example, after placing the second layer 14 on the support face 131 of the first layer 13, as illustrated in FIG. 8B, the first horizontal plate portion 43 of the spring member 4 is inserted into the accommodating hole 141 of the second layer 14. The thickness of the second layer 14 is set so as to be equal to the thickness of the first horizontal plate portion 43 of the spring member 4. Accordingly, the first horizontal plate portion 43 of the spring member 4 may be accommodated entirely in the accommodating hole 141 of the second layer 14 (see FIG. 6). In the support face 131 of the first layer 13, a region that corresponds to the accommodating hole 141 of the second layer 14 is referred to as an abutting face 131a. The abutting face 131a of the first layer 13 supports the first horizontal plate portion 43 in the state of abutting on one face of the first horizontal plate portion 43, which is a first principal face 43a included in the spring member 4 accommodated in the accommodating hole 141 of the second layer 14 (see FIG. 6).

Figure 8C:
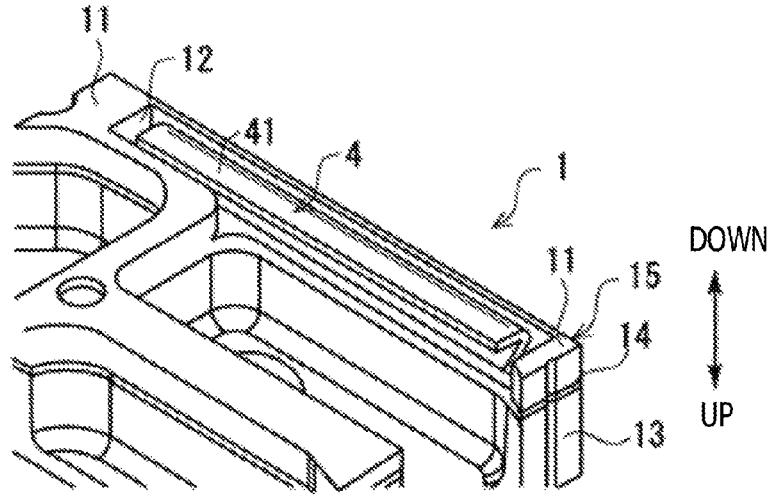
FIG. 8C is a third diagram that illustrates the process of embedding the spring member in the shield frame unit of the shield case according to the first embodiment.

After that, as illustrated in FIG. 8C, the third layer 15 is placed on the second layer 14. As illustrated in FIG. 7, the third layer 15 is provided with an insertion hole 151, which passes through the third layer 15 in the thickness direction and is shaped like a rectangle. The long-side length of the insertion hole 151 in the third layer 15 is equal to the long-side length of the accommodating hole 141 in the second layer 14, and the short-side length of the insertion hole 151 is shorter than the short-side length of the accommodating hole 141. The short-side length of the insertion hole 151 in the third layer 15 is longer than the short-side length of the second horizontal plate portion 44. As a result, in placing the third layer 15 on the second layer 14, the second horizontal plate portion 44 and the oblique plate portion 45 of the spring member 4 may be inserted into the insertion hole 151 without interfering with the insertion hole 151 in the third layer 15.

Further, the short-side length of the insertion hole 151 in the third layer 15 is set so as to be shorter than the short-side length of the first horizontal plate portion 43 of the spring member 4. Thus, after the second horizontal plate portion 44 and the oblique plate portion 45 of the spring member 4 are sequentially inserted into the insertion hole 151 in the third layer 15, a sandwich face 152 of the third layer 15 abuts on another face of the first horizontal plate portion 43, which is a second principal face 43b (see FIG. 6). The second principal face 43b of the first horizontal plate portion 43 is a principal face on the opposite side of the first principal face 43a. In this state, as illustrated in FIG. 6, the first principal face 43a and the second principal face 43b of the fixed portion 42 formed in an end portion of the first horizontal plate portion 43 are sandwiched between the abutting face 131a of the first layer 13 and the sandwich face 152 of the third layer 15.

After that, subsequently, while the fixed portion 42 of the spring member 4 is sandwiched between the abutting face 131a of the first layer 13 and the sandwich face 152 of the third layer 15, the diffused junction is performed on the first layer 13, the second layer 14, and the third layer 15 that are sequentially stacked. Detailed description of the diffused junction is omitted since such techniques are known. The first layer 13, the second layer 14, and the third layer 15 that are stacked as illustrated in FIG. 8C are placed in a furnace of a diffused junction apparatus, not illustrated, and pressurization and heating (thermal press) are performed in an atmosphere of vacuum, inert gas, or the like. Since the first layer 13, the second layer 14, and the third layer 15 are similar metallic materials, diffusion of atoms occurs on each junction face among these layers through the thermal press and the metallic materials are joined to one another on an atom basis. As a result, the first layer 13, the second layer 14, and the third layer 15 that make up the shield case 1 are integrally joined. In contrast, in the spring member 4, when the first layer 13, the second layer 14, and the third layer 15 are integrally joined in the state where the first horizontal plate portion 43 is accommodated in the accommodating hole 141 in the second layer 14, the fixed portion 42 is fixed between the abutting face 131a of the first layer 13 and the sandwich face 152 of the third layer 15. In the present embodiment, the fixing portion 12a where the fixed portion 42 of the spring member 4 is fixed is formed so as to include the abutting face 131a of the first layer 13 and the sandwich face 152 of the third layer 15, which sandwich the fixed portion 42.

As described above, the shield case 1 made by die casting may be obtained, where the spring members 4 are embedded in the shield frame unit 10. In other words, as illustrated in FIGS. 5 and 6, the shield case 1 may be obtained, where the contact face 41 of the spring member 4 is arranged so as to be parallel to the frame bottom face 11 of the shield frame unit 10, and the contact face 41 projects outside farther than the frame bottom face 11 as the second horizontal plate portion 44 extends off the spring accommodating depression 12.

Figure 9:
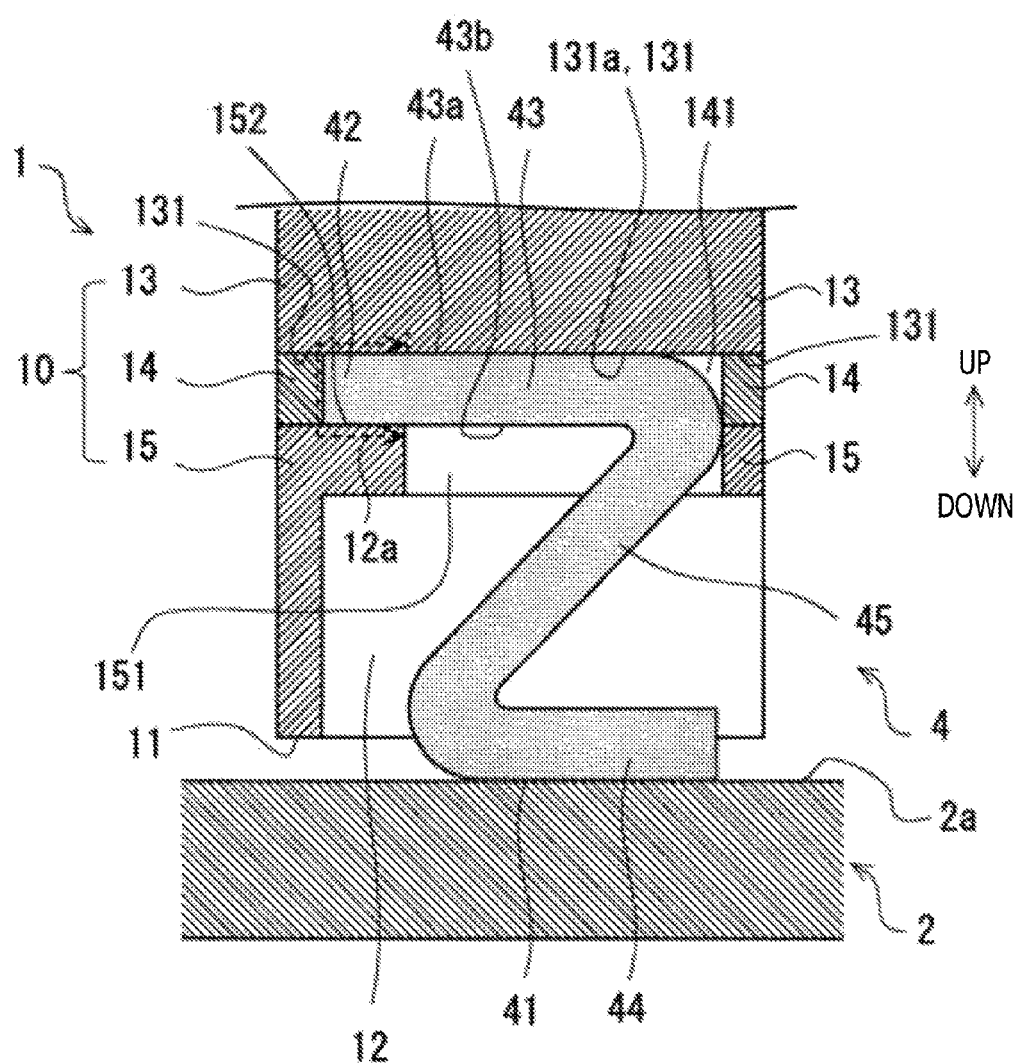
FIG. 9 is a cross-sectional view that illustrates a state where the shield case is placed over a mount face of the board according to the first embodiment.

The shield case 1 produced as described above is fixed to the board 2 so as to shield the electronic components mounted over the mount face 2a of the board 2. When the shield case 1 is placed in a predetermined position over the board 2 in fixing the shield case 1 to the board 2, as illustrated in FIG. 9, the contact face 41 of the spring member 4 projecting from the frame bottom face 11 of the shield frame unit 10 comes into the state of abutting on the mount face 2a of the board 2. FIG. 9 is a cross-sectional view that illustrates the state where the shield case 1 is placed over the mount face 2a of the board 2. In the state illustrated in FIG. 9, the frame bottom face 11 of the shield frame unit 10 in the shield case 1 comes into the state of being slightly spaced apart from the mount face 2a of the board 2, and a gap is caused between the frame bottom face 11 and the mount face 2a. As the screws 3 are inserted into the screw holes 3a passing through the shield frame unit 10, which are illustrated in FIGS. 2 and 4A, from this state and the shield case 1 is fastened (screwed) to the board 2, the contact faces 41 of the spring members 4 are pushed against the mount face 2a and the spring members 4 are pressed. As a result, as illustrated in FIG. 3, the contact faces 41 of the spring members 4 come into the state of closely contacting with (or closely adhering to) the mount face 2a.

Thus, in the shield case 1, the frame bottom face 11 may be brought into close adherence to the mount face 2a of the board 2 in the portions where the fixing is performed using the screws 3 and also in the portions where the spring members 4 are arranged, the contact faces 41 may be brought into close adherence to the mount face 2a and consequently, the shield property may be enhanced, compared to a typical shield case. In the shield case 1 according to the present embodiment, the total number of the screws 3 used to fix the shield case 1 to the board 2 may be decreased, compared to a typical shield case, by partially replacing the screws 3 in the portions where the fixing is performed using the screws 3 with the spring members 4. As a result, compared to a typical case where the close adherence property between a shield case and a mount face of a board is ensured only through fastening using screws, the weight and the number of assembly man-hours of the shield case 1 may be reduced.

Further, since in the present embodiment, the shield case 1 is caused to have a three-layer structure and the diffused junction is performed on the three layers after embedding the spring members 4 in the three layers so that the three layers are integrated, the spring members 4 for which a metallic material different from the shield frame unit 10 made by die casting is used may be fixed preferably. In addition, since the area of each junction face among the first layer 13, the second layer 14, and the third layer 15 is sufficiently ensured, the diffusion of atoms on each junction face among the layers may be promoted more preferably in performing the diffused junction.

<Variation>

Figure 10:
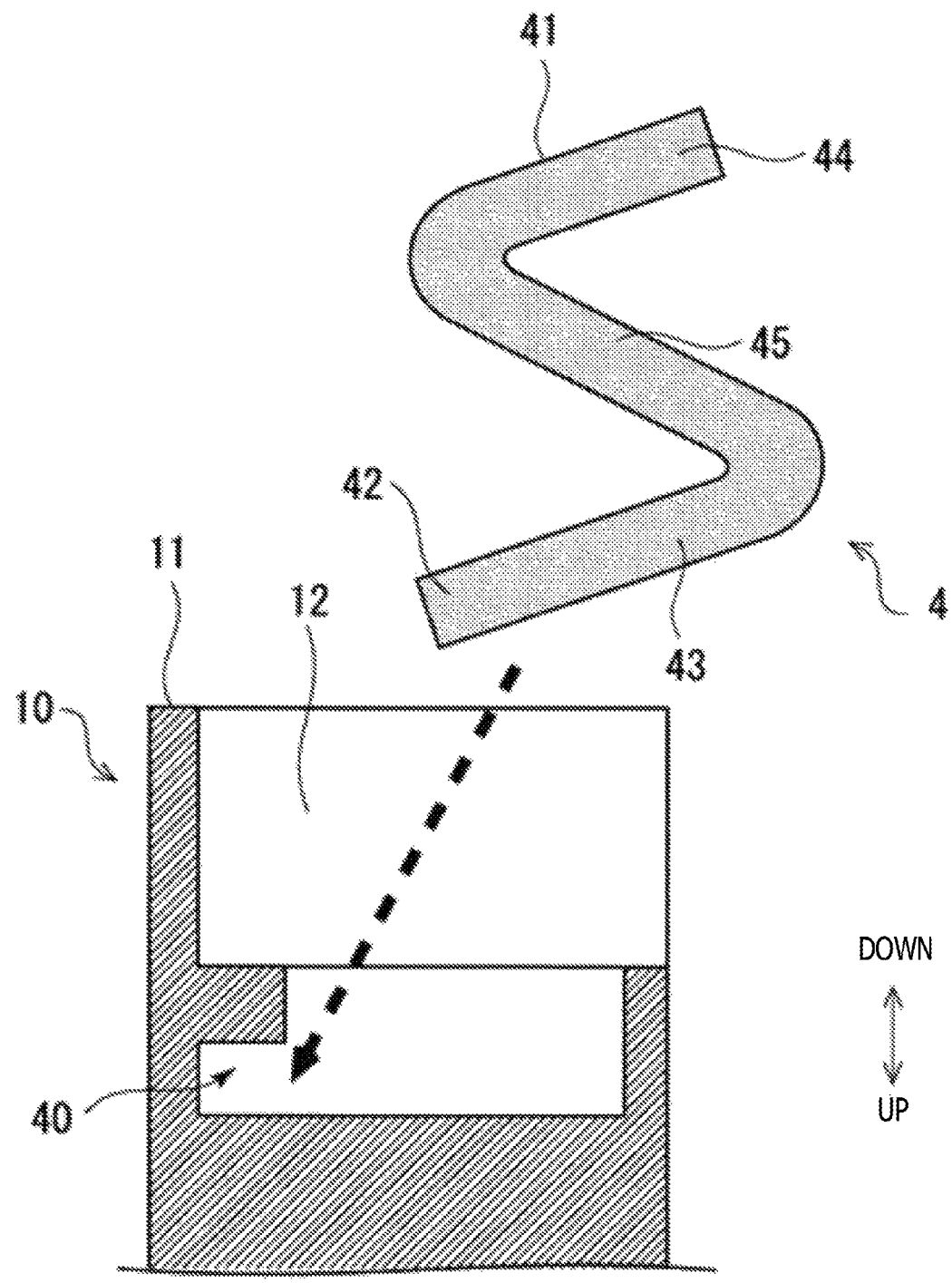
FIG. 10 is a first diagram that illustrates a variation of the shield case according to the first embodiment.
Figure 11:
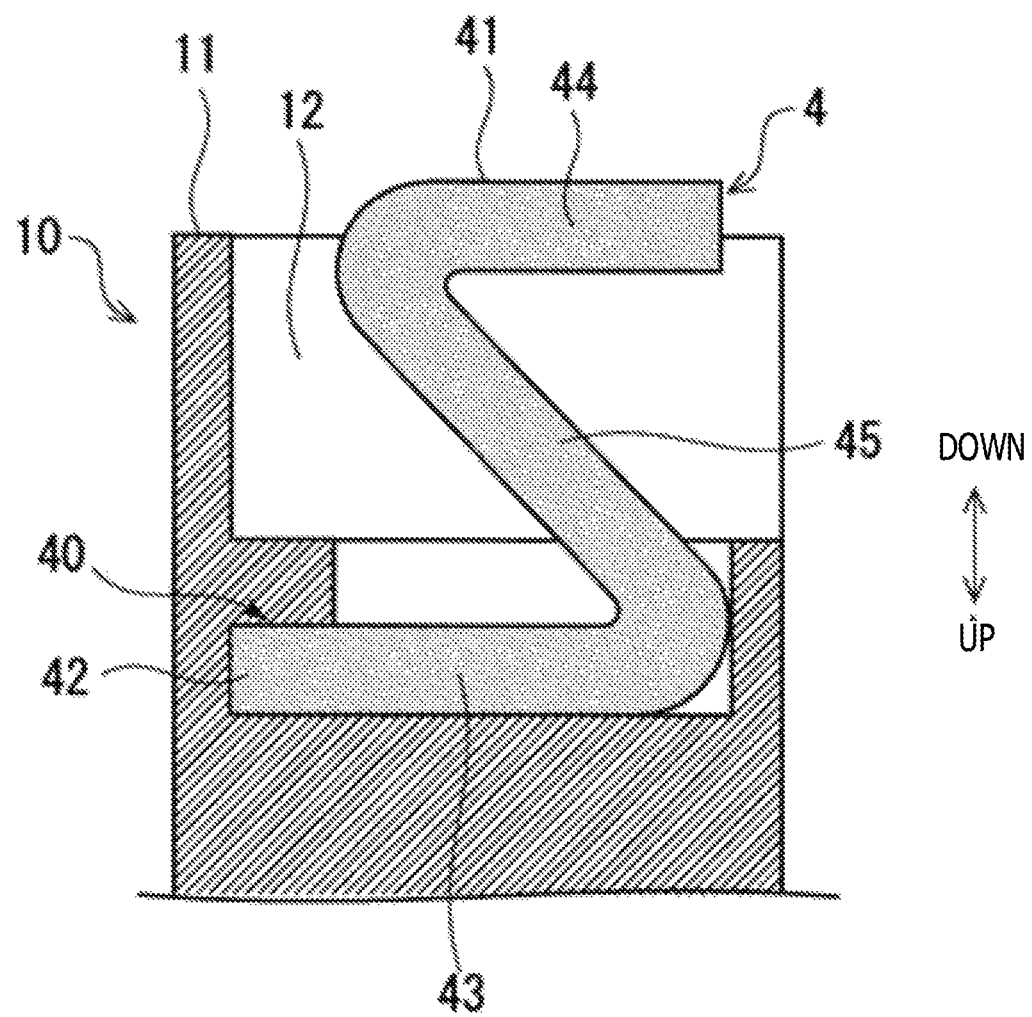
FIG. 11 is a second diagram that illustrates the variation of the shield case according to the first embodiment.

A variation of the shield case 1 according to the first embodiment is now described. For example, although in the above-described embodiment, the shield case 1 has a three-layer structure and the fixed portions 42 of the spring members 4 are sandwiched between the first layer 13 and the third layer 15, and then the diffused junction is performed so that the spring members 4 are embedded in the shield frame unit 10, the structure is not limited thereto. For example, in the variation illustrated in FIG. 10, the shield frame unit 10 including the spring accommodating depression 12 where a fit groove 40 into which the fixed portion 42 of the spring member 4 is fitted is provided, and the shield upper lid unit 20 are integrally molded by die casting. After that, the spring member 4 may be fixed to the shield frame unit 10 by inserting the spring member 4, which is prepared separately, into the spring accommodating depression 12 from the side of the fixed portion 42 so that the fixed portion 42 is fitted in and fixed to the fit groove 40 provided in the spring accommodating depression 12. Also in this manner, as illustrated in FIG. 11, the spring member 4 may be embedded in the spring accommodating depression 12 of the shield frame unit 10 and advantages similar to those brought by the above-described embodiment may be obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A shield case that shields an electronic component, the shield case comprising:
   a shield frame configured to be fastened to a board so as to surround the electronic component mounted over a mount face of the board; and
   a spring, attached to the shield frame, including:
      a first flat face configured to closely adhere to the mount face by being pressed when the shield frame is fastened; and
      a second flat face, provided opposite to the first flat face, configured to closely adhere to an inner surface of an accommodating depression provided in the shield frame and configured to accommodate the spring,
   wherein the accommodating depression includes a first layer which includes an abutting face that abuts on a first face of a fixed portion of the spring which is fixed to the accommodating depression, a second layer which includes an accommodating hole that passes through the second layer in a thickness direction and accommodates the fixed portion, and a third layer which includes a sandwich face that sandwiches the fixed portion between the sandwich face and the abutting face by abutting on a second face of the fixed portion.

2. The shield case according to claim 1, wherein the shield frame includes a frame bottom face configured to closely adhere to the mount face when the shield frame is fastened to the board, and before the shield frame is fastened to the board, a part of the spring is exposed outside the accommodating depression so that the first flat face of the spring projects farther than the frame bottom face.

3. The shield case according to claim 1, wherein the first layer, the second layer, and the third layer are integrated with one another by diffused junction and are sequentially stacked.

4. The shield case according to claim 1, wherein the shield case is made by die casting.

5. The shield case according to claim 1, wherein the accommodating depression includes an accommodating hole which accommodates a portion of the spring which includes the second flat face.

6. The shield case according to claim 1, wherein the second flat face is provided in parallel with the first flat face.

7. A shield case that shields an electronic component, the shield case comprising:
- a shield frame configured to be fastened to a board so as to surround the electronic component mounted over a mount face of the board; and
- a spring, attached to the shield frame, including a flat face configured to closely adhere to the mount face by being pressed when the shield frame unit is fastened,
- wherein the shield case is made by die casting, the accommodating depression is formed to include a first layer, a second layer, and a third layer that are integrated with one another by diffused junction and are sequentially stacked, the first layer includes an abutting face that abuts on a first face of a fixed portion of the spring, the fixed portion being fixed to the accommodating depression, the second layer includes an accommodating hole that passes through the second layer in a thickness direction and accommodates the fixed portion, and the third layer includes a sandwich face that sandwiches the fixed portion between the sandwich face and the abutting face by abutting on a second face of the fixed portion.

* * * * *